United States Patent [19]
Katayama

[11] Patent Number: 6,005,614
[45] Date of Patent: Dec. 21, 1999

[54] METHOD FOR CALIBRATING A MULTI-CHANNEL IMAGING SYSTEM

[75] Inventor: Andrew S. Katayama, Cardiff, Calif.

[73] Assignee: Eastman Kodak Company, Rochester, N.Y.

[21] Appl. No.: 08/820,623

[22] Filed: Mar. 19, 1997

[51] Int. Cl.$^6$ .............. H04N 9/64; H04N 5/225; H03M 1/62

[52] U.S. Cl. .............. 348/241; 348/243; 341/139

[58] Field of Search .............. 348/207, 241, 348/243, 244, 250, 247, 242, 245, 246, 249, 251, 607; 358/461; 341/118, 120, 121, 139

[56] References Cited

U.S. PATENT DOCUMENTS

| | | | |
|---|---|---|---|
| 4,070,707 | 1/1978 | Barber | 341/120 |
| 4,322,752 | 3/1982 | Bixby . | |
| 4,698,685 | 10/1987 | Beaverson | 348/246 |
| 4,771,267 | 9/1988 | Russell, Jr. et al. | 341/118 |
| 5,047,861 | 9/1991 | Houchin et al. | 348/247 |
| 5,565,916 | 10/1996 | Katayama et al. | 348/243 |

*Primary Examiner*—Wendy Garber
*Assistant Examiner*—Luong Nguyen
*Attorney, Agent, or Firm*—William F. Noval

[57] ABSTRACT

In a high speed video capture and display system including an $N_{channels}$ channel sensor for producing $N_{channels}$ parallel analog video signals, $N_{channels}$ signal processing channels for processing the analog video signals, each of the $N_{channels}$ signal processing channels including an analog-to-digital converter (ADC) having gain and offset which are controlled by controlling the common mode and differential voltages across each ADC ladder network; and a central processing unit for controlling the gain and offset by means of digital control signals; the method of calibrating the system to produce a uniform image comprising the steps of.

a) illuminating the sensor with a broadband and spatially uniform light source to determine $L_{max}$;

b) initially setting the common mode and differential voltages of each ADC to nominal settings;

c) illuminating the sensor with a spatially uniform broadband illumination $N_{illum}$ evenly spaced illumination levels;

d) for each of the illumination levels collect for each of the $N_{channels}$, $N_{samples}$ of spatially distributed pixels; and e) for each channel find the gain $m_j$ and the offset $b_j$;

f) calculating the desired corrections in gain $k_{mj}$ and offset $\Delta_{bj}$ by finding the specific channel whose gain $m_l$ represents the median gain value among the set of gains $m_j$ for all channels and for all channels computing $k_{mj}$ and $\Delta_{bj}$;

g) calculating and applying the desired correction in the digital common mode and span controls over all channels; and h) repeating steps b–g until convergence is reached.

4 Claims, 3 Drawing Sheets

METHOD FOR CALIBRATING A MULTI-CHANNEL IMAGING SYSTEM

FIELD OF INVENTION

This invention relates in general to high frame rate imaging systems and relates more particularly to high frame rate video capture and display system using a multi-channel sensor in which gain and offset of each channel is controlled to optimize system response.

BACKGROUND OF THE INVENTION

There are many applications which require the recording of hundreds or thousands of images per second. Such applications include automobile crash testing, missile range instrumentation and fault detection in high speed machinery. Typical high frame rate video cameras employ a multi-channel sensor to minimize channel bandwidth and data rate. (See, e.g., U.S. Pat. No. 4,322,752, issued Mar. 30, 1982, inventor Bixby). One of the difficulties to be dealt with in using such a sensor is the requirement that the transfer characteristic, relating output signal amplitude to sensor illumination, be closely matched across all channels. Under uniform sensor illumination, matching errors larger than approximately 1% can be readily detected by the human eye. If the transfer function is linear, uniformity can be achieved by adjusting individual channel gain and offset.

In a known color fast frame imaging system, a sixteen channel sensor is employed, wherein the sensor is read out as sixteen parallel channels of analog video signals. The system electronics supports the sensor with sixteen independent channels of analog and digital processing including an analog-to-digital converter (ADC). Two controls control the respective channels gain and offset by adjusting the top and bottom ladder electrical potentials of the respective channel's ADC. In the known procedure, each channel's offset control was adjusted while the sensor was capped (kept in darkness) to balance each channel's average video level to the system black setup value. Subsequently, each channel's gain control was adjusted to balance each channel's average video value to the global average video level in the presence of a broad-band flat field light source.

A drawback to this procedure is that it assumes a linear response, but indirect evidence has shown that a non-linear response may be occurring. When left uncompensated for, this lack of linearity in the sensor response has implications beyond a non-linear rendering of intensity values. The greatest impact of the non-linearity is in regards to its effects on the color reproduction. Any departure from the ideal response immediately begins to color the rendering of neutrals in the scene for typical lighting situations. This is because such departures can be looked at as an offset from the ideal response. This offset is multiplied by the white balance gains of which there are three different gains for each of the three color components. Thus, this singular offset now behaves as three different offsets for each of the color planes. When these offsets are added to the rendering of a neutral scale, the result is a false coloration of the scene. Furthermore, the very nature of the non-linearity has been seen to vary from channel to channel. Thus, the false coloration of neutrals can appear to vary abruptly across channel boundaries.

SUMMARY OF THE INVENTION

According to the present invention, there is provided a solution to the needs of the prior art.

According to one aspect of the present invention, there is provided a high speed video capture and display system including an $N_{channels}$ sensor for producing $N_{channels}$ parallel analog video signals, $N_{channels}$ signal processing channels for processing the analog video signals, each of the $N_{channels}$ signal processing channels including an analog-to-digital converter (ADC) having gain and offset which are controlled by controlling the common mode and differential voltages across each ADC ladder network; and a central processing unit for controlling the gain and offset by means of digital control signals; the method of calibrating the system to produce a uniform image comprising the steps of:

a) illuminating the sensor with a broadband and spatially uniform light source to determine $L_{max}$;

b) initially setting the common mode and differential voltages of each ADC to nominal settings;

c) illuminating the sensor with a spatially uniform broadband illumination at $N_{illum}$ evenly spaced illumination levels;

d) for each of the illumination levels collect for each of the $N_{channels}$, $N_{samples}$ of spatially distributed pixels; and e) for each channel find the gain $m_j$ and the offset $b_j$;

f) calculating the desired corrections in gain $k_{mj}$ and offset $\Delta_{bj}$ by finding the specific channel whose gain $m_I$ represents the median gain value among the set of gains $m_j$ for all channels and for all channels computing $k_{mj}$ and $\Delta_{bj}$;

g) calculating and applying the desired correction in the digital common mode and span controls over all channels; and h) repeating steps b–g until convergence is reached.

ADVANTAGEOUS EFFECT OF THE INVENTION

The present invention has the following advantages.

1. Existing gain and offset controls are optimized to achieve a balanced neutral scale for the linear portion of the response.

2. Rendering errors are redistributed towards the shadows rather than being distributed throughout the response.

DETAILED DESCRIPTION OF THE INVENTION

Figure 1:
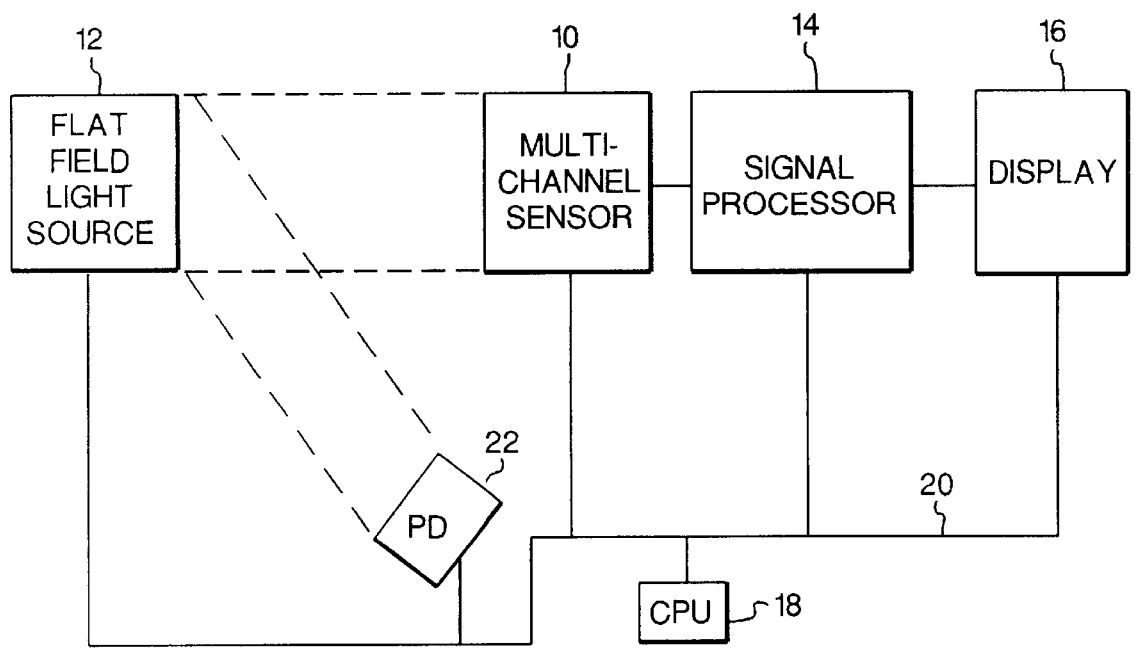
FIG. 1 is a block diagram of an imaging system incorporating the present invention.

Referring now to FIG. 1, there is shown a block diagram of an imaging system incorporating the present invention. As shown, a multichannel CCD image sensor 10 receives illumination from flat field light source 12. Sensor 10 produces a multichannel image signal which is processed by multichannel signal processor 14. The processed signal is stored and displayed on display 16. A central processing unit (CPU) 18 transmits and receives control and data signals to components 10,12,14,16 over bus 20. A photodiode 22 receives light from light source 12 and is controlled by CPU 18.

Figure 4:
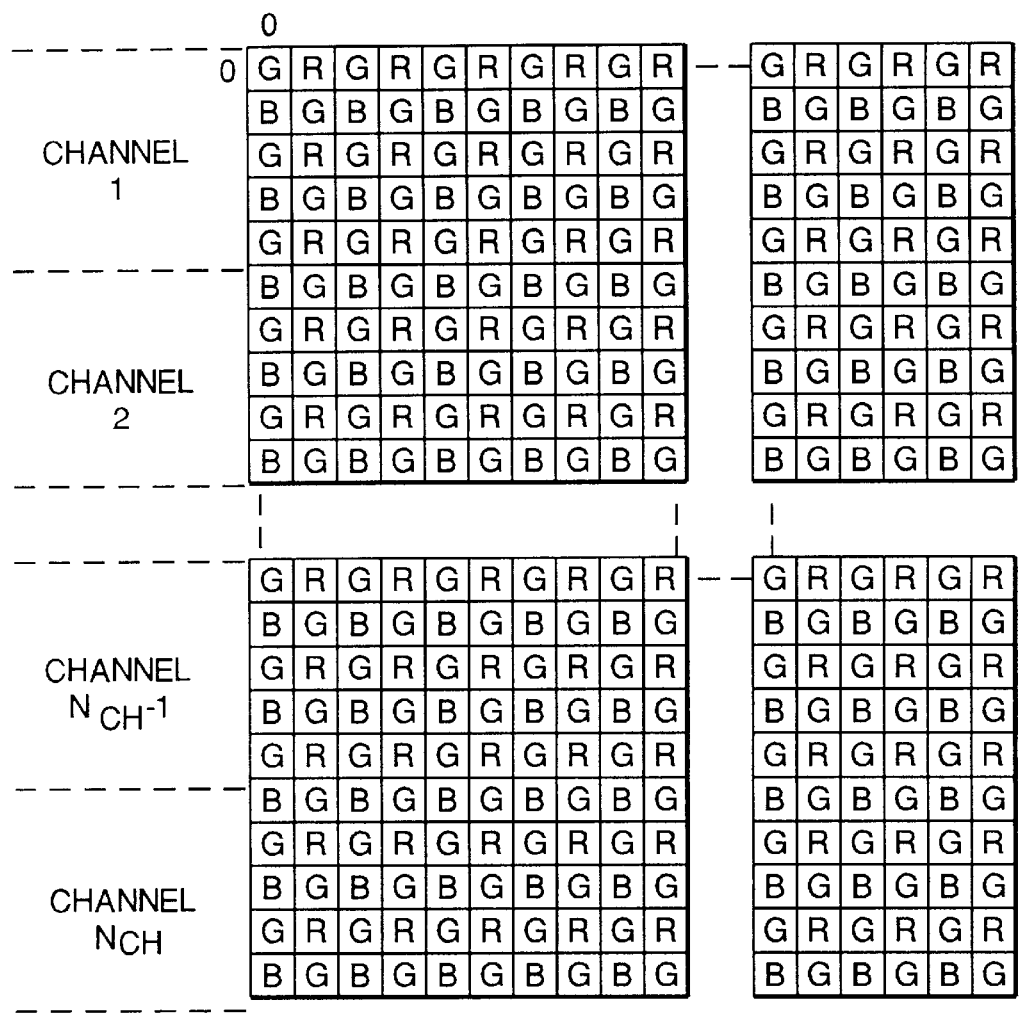
FIG. 4 is a diagrammatic view of a color CCD sensor using a color filter array.

Sensor 10 is a multichannel CCD sensor having a matrix of photosites divided into channels numbered 1 to $N_{channels}$ channels. Sensor 10 can be a black and white sensor, wherein each photosite is read out as a black and white pixel. Sensor 10 can also be a color CCD sensor, as shown in FIG. 4, having a color filter array, wherein each pixel is read out as a single color R, G, B corresponding to a color filter array filter element. As shown in FIG. 4, the color filter array is formed of repeating GR/BG arrays. The single color pixels are transformed into RGB tricolor pixels through spatial transfer processing in signal processor 14. As shown, each channel numbered 1 to $N_{channels}$ includes five rows of photosites. It will be understood that any other color matrix and other colors such as cyan, magenta, and yellow can be used.

Figure 2:
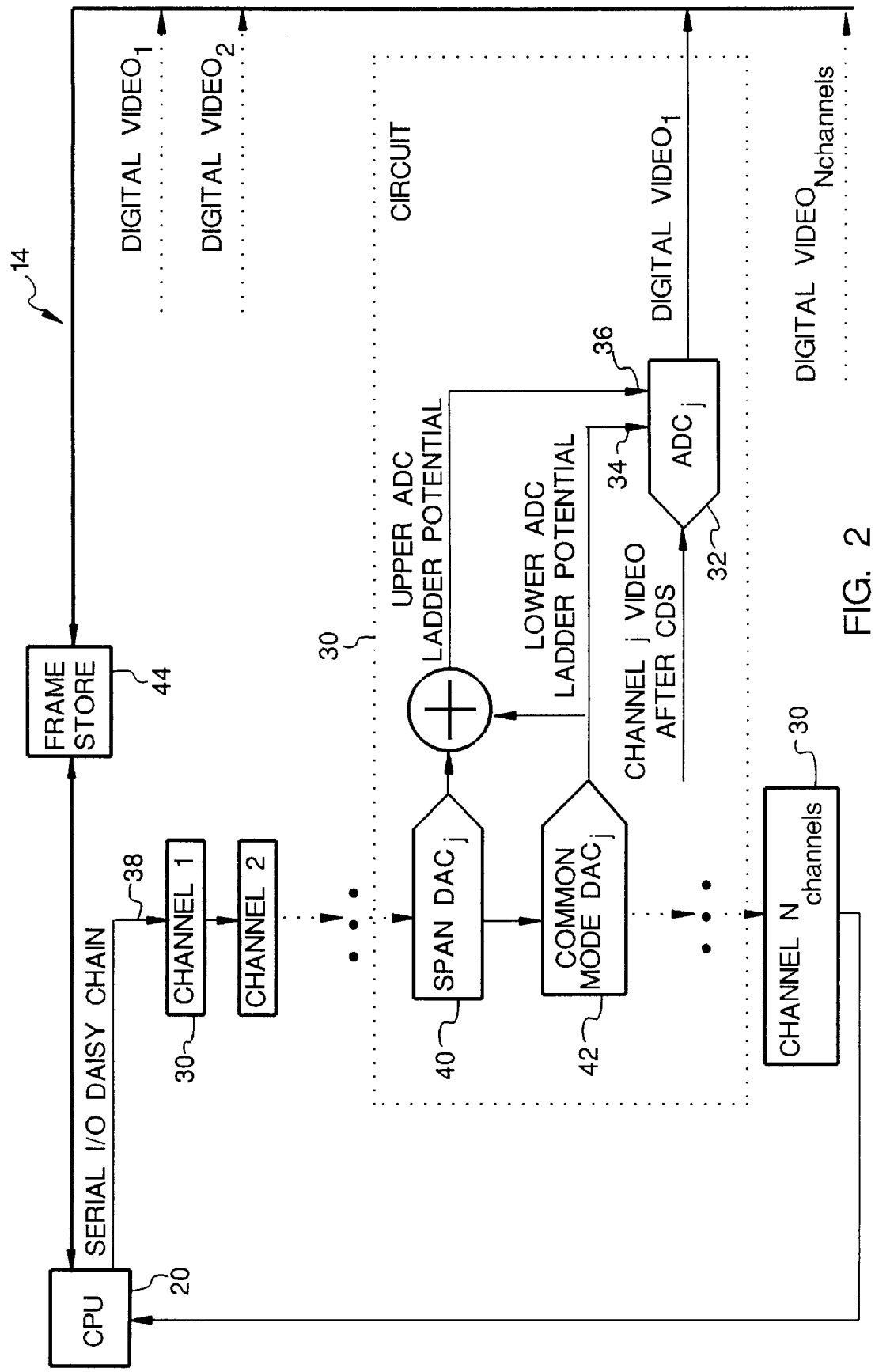
FIG. 2 is a block diagram of the signal processor of FIG. 1.

Referring to FIG. 2, there is shown a block diagram of the signal processor of FIG. 1. As shown, signal processor 14 includes among other components signal processing circuits 30 for channels numbered 1 to $N_{channels}$ for processing $N_{channels}$ image signals from sensor 10. Each circuit 30 includes an ADC 32 having a lower ADC ladder potential input 34 and an upper ADC ladder potential input 36. The potentials at inputs 34 and 36 are controlled respectively by CPU 20 through digital control signals sent over serial I/O daisy chain 38 to SPAN DAC and COMMON MODE DAC 42 which convert the digital control signals to analog-electrical potentials. Adder 44 receives signals from DACs 40 and 42. The digital video from each ADC 32 is stored in Frame Store 44.

Figure 3:
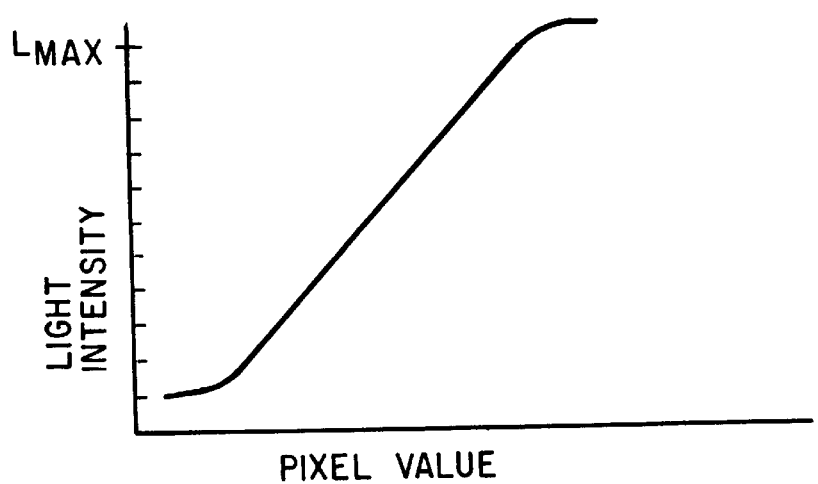
FIG. 3 is a graphical diagram of light intensity versus image pixel value.

FIG. 3 is a graphical diagram of light intensity versus image pixel value. Depicted are exemplary light source illumination values (including $L_{max}$) used in the calibration method described below.

The calibration method of the present invention will now be described in detail having reference to FIGS. 1–4.

Goal of the channel balancing method

The goal of the channel balancing method is to ensure the proper reproduction of color when the sensor is operated in an area where its response curve is linear. To accomplish this goal, the gains must be adjusted such that this linear portion of the response curve for the channel in question has an equivalent slope to that of the remaining channels. Furthermore, the offsets must be adjusted such that the linear portion of the curve, when extrapolated out to the condition of no illumination, is equivalent to the system black setup level for all channels of the sensor.

The basic channel balancing method and derivation
The basic idea:

Attempt to balance the gain and offsets of all channels such that their "pseudo-linear" portions of their response curves have a least-means-squared fit to the function:

$$y = mx + b$$

$$x \in [0 \ldots 1]$$

where:

$$y \in [0 \ldots 255]$$
$$b = \text{black\_setup}$$

The points sampled:

Select $N_{illum}$ evenly spaced points $$x_i = \frac{i}{N_{illum}}$$

for $i \in [1 \ldots N_{illum}]$.

Each of these xi corresponds in the experiment to a spatially uniform broadband illumination of $i^*L_{max}/N_{illum}$ for $i \in [1 \ldots N_{illum}]$ ($L_{max}$ must be suitably chosen such that there is no clipping of the video when the algorithm runs.)

The data collected:

From these $x_i$, collect from each of the $N_{channels}$ channels $N_{samples}$ spatially distributed green samples of the resultant pixel values $y_{ijk}$ for $i \in [1 \ldots N_{illum}]$, $j \in [1 \ldots N_{channels}]$, and $k \in [1 \ldots N_{samples}]$.

The data computed:

For each channel $j \in [1 \ldots N_{channels}]$, find $m_j$ and $b_j$ for the least means squared fit to a linear curve:

Solve for $m_j$ and $b_j$ for each channel $j \in [1 \ldots N_{channels}]$ over $i \in [1 \ldots N_{illum}]$ illumination levels and $k \in [1 \ldots N_{samples}]$ samples at each illumination level, with the digital common mode and span controls set to nominal (optional, but recommended for the first iteration of the algorithm; however, successive iterations must not set these controls to nominal) via the following system of linear equations:

$$\begin{bmatrix} N_{samples} N_{illum} & \sum_{i=1,k=1}^{i=N_{illum},i=N_{samples}} x_i \\ \sum_{i=1,k=1}^{i=N_{illum},k=N_{samples}} x_i & \sum_{i=1,k=1}^{i=N_{illum},i=N_{samples}} x_i^2 \end{bmatrix} \begin{bmatrix} b_j \\ m_j \end{bmatrix} = \begin{bmatrix} \sum_{i=1,k=1}^{i=N_{illum},k=N_{samples}} y_{ijk} \\ \sum_{i=1,k=1}^{i=N_{illum},k=N_{samples}} x_{ijk} y_{ijk} \end{bmatrix}$$

whose solution is:

$$\begin{bmatrix} b_j \\ m_j \end{bmatrix} =$$

$$\frac{12}{N_{samples}(N_{illum}+1)(N_{illum}-1)} \begin{bmatrix} \frac{(N_{illum}+1)(2N_{illum}+1)}{6N_{illum}} \sum_{i=1,k=1}^{i=N_{illum},k=N_{samples}} y_{ijk} - \frac{(N_{illum}+1)}{2N_{illum}} \sum_{i=1,k=1}^{i=N_{illum},k=N_{samples}} i y_{ijk} \\ \sum_{i=1,k=1}^{i=N_{illum},k=N_{samples}} i y_{ijk} - \frac{(N_{illum}+1)}{2} \sum_{i=1,k=1}^{i=N_{illum},k=N_{samples}} y_{ijk} \end{bmatrix}$$

Choose a specific channel as a reference gain channel:

Over all channels $j \in [1 \ldots N_{channels}]$, select a specific channel l whose gain term $m_l$ represents the median value amongst the set of gains $m_j$, where $j \in [1 \ldots N_{channels}]$.

Calculate the desired corrections $k_{mj}$ and $\Delta_{bj}$ to each channel's gain $m_j$ and offset $b_j$ terms:

Over all channels $j\in[1\ldots N_{channels}]$, compute

Over all channels $j \in [1 \ldots N_{channels}]$, compute $$k_{m_j} = m_l/m_j$$

and $$\Delta_{b_j} = \frac{b}{k_{m_j}} - b_j$$

[Note: The $$\frac{1}{k_{m_j}}$$

correction term may seem odd here. It comes about because, unlike the $b_j$ term, the b term represents a value relating to conditions not as they exist now, but after this algorithm is run. Therefore, one must take into account the very likely possibility that the span will change in addition to the offset, and as a change in span alone will cause any non-zero offset to move as well, this must be corrected for.]

Determine the changes necessary in the bottom A/D ladder potential $$\Delta_{v_{bottom j}}$$

and its top to bottom span $$\Delta_{v_{span j}}$$

to effect the above corrections, and ultimately to the changes in the control values $$\Delta_{m_{jdigital\_control}}$$

and $$\Delta_{b_{jdigital\_control}}:$$

Over all channels $j\in[1\ldots N_{channels}]$, we note that $$\Delta_{v_{bottom j}} = \frac{\Delta_{b_j}}{256} * v_{span j}$$

…and…

$$\Delta_{v_{span j}} = \left(\frac{1}{k_{m_j}} - 1\right) v_{span j}$$

Note that the first of the two previous equations will change as a function of the implementation details. This equation relates a change of digital value in the common mode control, $\Delta_{bj}$, to a change in the bottom ladder potential, $$\Delta_{b_{bottom j}},$$

by a small signal gain in units of $$\left(\frac{\text{volts}}{\text{bit}}\right).$$

$$(m_{j_{digital\_control}}$$

and $$b_{j_{digital\_control}}$$

represent the current digital control values for gain and offset, respectively)

$$v_{top\,j} = \frac{809}{256000}\left(m_{j_{digital\_control}} + b_{j_{digital\_control}}\right) + 0.2$$

…and…

$$v_{bottom\,j} = \frac{809}{256000} b_{j_{digital\_control}} - 1.4$$

Note that the previous two equations will also change as a function of the implementation details. The first equation relates the digital common mode and span control values to the voltage of the top A/D ladder potential, and the second equation relates the digital common mode control to the voltage of the bottom A/D ladder potential. As a consequence, the following derivations will also vary in its numerical details as a function of the particular implementation.

$$\therefore v_{span\,j} = v_{top\,j} - v_{bottom\,j}$$
$$= \frac{809}{256000} m_{j_{digital\_control}} + 1.6$$

…and…

$$\Delta v_{bottom\,j} = -\frac{\Delta_{b_j}}{256} * \left(\frac{809}{256000}\right) m_{j_{digital\_control}} - 1.6$$

⇒ the following finite differences…

$$\Delta_{b_{j_{digital\_control}}} = \Delta_{v_{bottom\,j}} \frac{256000}{809}$$

…and…

$$\Delta_{m_{j_{digital\_control}}} = \Delta_{v_{span\,j}} \frac{256000}{809}$$

$$\therefore \Delta_{b_{j_{digital\_control}}} = -\frac{\Delta_{b_j}}{256} * \left(m_{j_{digital\_control}} + \frac{409600}{809}\right)$$

…and…

$$\Delta_{v_{span\,j}} = \left(\frac{1}{k_{m_j}} - 1\right)\left(\frac{809}{256000}\, m_{j_{digital\_control}} + 1.6\right)$$

$$\Delta_{m_{j_{digital\_control}}} = \left(\frac{1}{k_{m_j}} - 1\right)\left(m_{j_{digital\_control}} + \frac{409600}{809}\right)$$

We now are left with the quantities $$\Delta_{b_{j_{digital\_control}}}$$

and $$\Delta m_{j_{digital\_control}}.$$

These results indicate the amount by which respectively the digital common mode $$(b_{j_{digital\_control}})$$

and span $$(m_{j_{digital\_control}})$$

controls should be adjusted to effect the desired corrections, as demonstrated below:

$$b_{j_{digital\_control}} = b_{j_{digital\_control}} + \Delta_{b_{digital\_control}}$$

and $$m_{j_{digital\_control}} = m_{j_{digital\_control}} + \Delta m_{j_{digital\_control}}$$

Other implementation details
Selection of $N_{illum}$

The algorithm requires that $N_{illum}$, the number of illumination levels to be used in the calibration, be known at run time. This parameter must be determined via experiment on a broad number of systems and sensors. There are two competing influences on the selection of this number. A higher value of $N_{illum}$ allows for a greater sampling of the sensor response curve, but since this number also determines the total number of equally spaced illumination values, it also has the effect of lowering the smallest illumination level sampled. Thus, with increasing $N_{illum}$, it increases the number of samples taken in the area where we suspect a non-linear response from the sensor. Lowering it, however, decreases the total number of samples, resulting in less noise averaging. We have found by experiment that for our system, $N_{illum}=10$ results in the best overall results.

Iterating the algorithm

The algorithm is based on a feed-forward technique. That is, given a measured error in the output response, it computes the correction necessary in the control values to null the error metric based on ideal circuit response and component values. Thus, in any real implementation, there is always a finite amount of error in the final correction. The algorithm deals with that situation by iteration. That is, the first iteration takes $N_{illum}$ samples of the sensor response and computes and applies the necessary corrections. The next iteration takes another $N_{illum}$ samples of the sensor response with the controls set by the previous iteration and computes and applies a smaller, second set of corrections. The only difference in the second and future iterations is that the digital common mode and span control values are retained from the previous iteration. These iterations can be done as long as is necessary to achieve the desired result. In our system testing, we have found that two iterations is sufficient to guarantee a satisfactory result.

A step by step example of operating the algorithm

Note: the following operations applies in all its detail to our particular implementation. As was described in the dialog above, particular aspects of the algorithm will be numerically dependent on the particular circuit implementation.

1. find $L_{max}$:

1.1 Adjust a broadband and spatially uniform light source upwards in intensity until the first pixels in the image start to saturate or clip.

1.2 Slowly decrease the intensity until all of the pixels are safely out of saturation or clipping.

1.3 Call this light level $L_{max}$ (FIG. 4), and record its level by a photometer 22 (FIG. 1).

2. Initialize digital common mode and span controls (FIG. 2):

2.1 If this is the first iteration of the algorithm, it is recommended to set the digital control values for the common mode and span controls to nominal. This, however, must not be done if this the second or successive iteration of a multiple iteration calibration.

3. Take samples of the system response:

3.1 repeat for i=$N_{illum}$ to 1:

3.1.1 Set the light level via the photometer 22 (FIG. 1) to $i*L_{max}/N_{illum}$.

3.1.2 Record a sufficient number of frames to eliminate any random and correlated temporal noise.

3.1.3 Sum the pixels of a given channel to obtain a single figure which represents the sensor response to the illumination. This can be, for a CFA sensor, for example, only a sum of the green pixels of each channel, or a weighted average of the red, green and blue pixels. The choice of the sampling grid is a function of the application, but must take into account the avoidance of any known spatially correlated noise. (Our implementation avoids the edges of the sensor, as well as the first few columns of each sensor channel.)

3.1.4 Record for each iteration the metric chosen for step 3.1.3. As an example of one possible implementation, we will show it as just a numerical sum of the measured pixels:

$$\sum_{k=1}^{k=N_{samples}} y_{ijk}.$$

3.1.5 Perform step 3.1.4 for each of the channels j.

3.2 With each iteration, we have the quantity $$\sum_{k=1}^{k=N_{samples}} y_{ijk}.$$

Now sum these quantities across all iterations i as follows:

$$\sum_{i=1}^{i=N_{illum}} \sum_{k=1}^{k=N_{samples}} y_{ijk} = \sum_{i=1, k=1}^{i=N_{illum}, k=N_{samples}} y_{ijk},$$

and $$\sum_{i=1}^{i=N_{illum}} i \cdot \sum_{k=1}^{k=N_{samples}} y_{ijk} = \sum_{i=1,k=1}^{i=N_{illum},k=N_{samples}} iy_{ijk}.$$

4. calculate the measured gain and offset for each channel:
4.1 compute for each channel j the following:

$$\begin{bmatrix} b_j \\ m_j \end{bmatrix} = \frac{12}{N_{samples}(N_{illum}+1)(N_{illum}-1)} \begin{bmatrix} \frac{(N_{illum}+1)}{6N_{illum}} \sum_{i=1,k=1}^{i=N_{illum},k=N_{samples}} y_{ijk} - \frac{(N_{illum}+1)}{2N_{illum}} \sum_{i=1,k=1}^{i=N_{illum},k=N_{samples}} iy_{ijk} \\ \sum_{i=1,k=1}^{i=N_{illum},k=N_{samples}} iy_{ijk} - \frac{(N_{illum}+1)}{2} \sum_{i=1,k=1}^{i=N_{illum},k=N_{samples}} y_{ijk} \end{bmatrix}$$

5. calculate the desired correction in gain and offset $k_{mj}$ and $\Delta_{bj}$:
  5.1 Find the specific channel l whose gain term $m_l$ represents the median gain value amongst the set of gains $m_j$, where $j\epsilon[1 \ldots N_{channels}]$
  5.2 Over all channels $j\epsilon[1 \ldots N_{channels}]$, compute:

$$k_{mj} = m_l/m_j$$

5.3 Over all channels $j\epsilon[1 \ldots N_{channels}]$, compute:

$$\Delta_{b_j} = \frac{b}{k_{m_j}} - b_j$$

6. calculate and apply the desired correction in the digital common mode and span controls:
  6.1 Over all channels $j\epsilon[1 \ldots N_{channels}]$ compute:

$$\Delta_{b_{j_{digital\_control}}} = -\frac{\Delta_{b_j}}{256} * \left( m_{j_{digital\_control}} + \frac{409600}{809} \right)$$

6.2 Over all channels $j\epsilon[1 \ldots N_{channels}]$, apply the following correction:

$$b_{j_{digital\_control}} = b_{j_{digital\_control}} + \Delta_{b_{j_{digital\_control}}}$$

6.3 Over all channels $j\epsilon[1 \ldots N_{channels}]$, compute:

$$\Delta_{m_{j_{digital\_control}}} = \left( \frac{1}{k_{m_j}} - 1 \right) \left( m_{j_{digital\_control}} + \frac{409600}{809} \right)$$

6.4 Over all channels $j\epsilon[1 \ldots N_{channels}]$, apply the following correction:

$$m_{j_{digital\_control}} = m_{j_{digital\_control}} + \Delta_{m_{j_{digital\_control}}}$$

7. Repeat from step 1 as necessary for algorithm convergence.
8. The system should now be calibrated for proper operation.

The invention has been described in detail with particular reference to a preferred embodiment thereof, but it will be understood that variations and modifications can be effected within the spirit and scope of the invention.

| PARTS LIST | |
|---|---|
| 10 | sensor |
| 12 | light source |
| 14 | signal processor |

| -continued | |
|---|---|
| PARTS LIST | |
| 16 | display |
| 18 | central processing unit |
| 20 | bus |
| 22 | photodiode |
| 30 | circuit |
| 32 | analog-to-digital converter |
| 34, 36 | inputs |
| 38 | serial I/O daisy chain |
| 40 | SPAN DAC |
| 42 | COMMON MODE DAC |
| 44 | frame store |

What is claimed is:

1. In a high speed video capture and display system including an $N_{channels}$ channel sensor for producing $N_{channels}$ parallel analog video signals, $N_{channels}$ signal processing channels for processing said analog video signals, each of said $N_{channels}$ signal processing channels including an analog-to-digital converter (ADC) having gain and offset which are controlled by controlling a common mode and differential voltages across each ADC ladder network; and a central processing unit for controlling said gain and offset by means of digital control signals; the method of calibrating said system to produce a uniform image comprising the steps of:

a) illuminating said sensor with a broadband and spatially uniform light source to determine $L_{max}$;
  b) initially setting the common mode and differential voltages of each ADC to nominal settings;
  c) illuminating said sensor with a spatially uniform broadband illumination at $N_{illum}$ evenly spaced illumination levels;
  d) for each of the illumination levels collecting for each of the $N_{channels}$, $N_{samples}$ of spatially distributed pixels;
  e) for each channel finding the gain $m_j$ and the offset $b_j$;
  f) calculating the desired corrections $k_{mj}$ and $\Delta_{bj}$ respectively to gain $m_j$ and offset $b_j$ by finding a specific channel whose gain $m_l$ represents the median gain value among the set of gains $m_j$ for all channels and for all channels computing $k_{mj}$ and $\Delta_{bj}$;
  g) calculating and applying the desired correction in the common mode and span controls over all channels; and
  h) repeating steps b–g until convergence is reached.

$$\left[\begin{array}{c} b_j \\ m_j \end{array}\right] =$$

$$\frac{12}{N_{samples}(N_{illum}+1)(N_{illum}-1)} \left[ \begin{array}{c} \frac{(N_{illum}+1)(2N_{illum}+1)}{6N_{illum}} \sum_{i=1,k=1}^{i=N_{illum},k=N_{samples}} y_{ijk} - \frac{(N_{illum}+1)}{2N_{illum}} \sum_{i=1,k=1}^{i=N_{illum},k=N_{samples}} iy_{ijk} \\ \sum_{i=1,k=1}^{i=N_{illum},k=N_{samples}} iy_{ijk} - \frac{(N_{illum}+1)}{2} \sum_{i=1,k=1}^{i=N_{illum},k=N_{samples}} y_{ijk} \end{array} \right]$$

2. The method of claim 1 wherein in step e) the gain $m_j$ and offset $b_j$ are calculated as follows:

3. The method of claim 1 wherein in step b) $k_{mj}$ and $\Delta_{bj}$ are calculated as follows:

$$k_{m_j} = m_l / m_j$$

and $$\Delta_{b_j} = \frac{b}{k_{m_j}} - b_j$$

4. The method of claim 1 wherein in step g) the desired correction in the common mode and span controls are calculated as follows:

over all channels $j \in [1 \ldots N_{channels}]$ compute:

$$\Delta_{b_{j_{digital\_control}}} = -\frac{\Delta_{b_j}}{256} * \left( m_{j_{digital\_control}} + \frac{409600}{809} \right)$$

over all channels $j \in [1 \ldots N_{channels}]$ apply the following correction:

$$b_{j_{digital\_control}} = b_{j_{digital\_control}} + \Delta_{b_{j_{digital\_control}}}$$

over all channels $j \in [1 \ldots N_{channels}]$ compute:

$$\Delta_{m_{j_{digital\_control}}} = \left( \frac{1}{k_{m_j}} - 1 \right) \left( m_{j_{digital\_control}} + \frac{409600}{809} \right)$$

over all channels $j \in [1 \ldots N_{channels}]$, apply the following correction:

$$m_{j_{digital\_control}} = m_{j_{digital\_control}} + \Delta_{m_{j_{digital\_control}}}.$$

* * * * *

UNITED STATES PATENT AND TRADEMARK OFFICE
CERTIFICATE OF CORRECTION

PATENT NO.   : 6,005,614
DATED        : December 21, 1999
INVENTOR(S)  : Andrew S. Katayama It is certified that error appears in the above-identified patent and that said Letters Patent is hereby corrected as shown below:

Column 11,
Lines 1-17, claim 2 should read as follows:
2. The method of claim 1 wherein in step e) the gain $m_j$ and offset $b_j$ are calculated as follows:

$$\begin{bmatrix} b_j \\ m_j \end{bmatrix} = \frac{12}{N_{samples}(N_{illum}+1)(N_{illum}-1)} \begin{bmatrix} \frac{(N_{illum}+1)(2N_{illum}+1)}{6N_{illum}} \sum_{i=1;k=1}^{i=N_{illum};k=N_{samples}} y_{ijk} - \frac{(N_{illum}+1)}{2N_{illum}} \sum_{i=1;k=1}^{i=N_{illum};k=N_{samples}} iy_{ijk} \\ \sum_{i=1;k=1}^{i=N_{illum};k=N_{samples}} iy_{ijk} - \frac{(N_{illum}+1)}{2} \sum_{i=1;k=1}^{i=N_{illum};k=N_{samples}} y_{ijk} \end{bmatrix}$$

Signed and Sealed this

Eighteenth Day of September, 2001

Attest:

*Nicholas P. Godici*

NICHOLAS P. GODICI
*Attesting Officer*      *Acting Director of the United States Patent and Trademark Office*